United States Patent [19]

Egan

[11] 4,115,745
[45] Sep. 19, 1978

[54] PHASE LOCK SPEED-UP CIRCUIT

[75] Inventor: William F. Egan, Cupertino, Calif.

[73] Assignee: GTE Sylvania Incorporated, Mountain View, Calif.

[21] Appl. No.: 839,330

[22] Filed: Oct. 4, 1977

[51] Int. Cl.² .............................................. H03B 3/04
[52] U.S. Cl. .................................... 331/17; 328/127; 331/1 A
[58] Field of Search .......................... 331/17, 1 A, 18; 328/127, 155; 307/232

[56] References Cited

U.S. PATENT DOCUMENTS

| | | | |
|---|---|---|---|
| 3,828,271 | 8/1974 | Schwanauer | 331/17 |
| 3,879,676 | 4/1975 | Schulz | 331/17 |
| 3,913,022 | 10/1975 | Kinoshita | 328/127 |

Primary Examiner—John Kominski
Attorney, Agent, or Firm—John F. Lawler

[57] ABSTRACT

This invention concerns a circuit which decreases the time required for certain phase-locked loops to pull in, that is, the time for the frequency of the oscillator which the loop controls to go from some initial error to some specified smaller error. The circuit is utilized with a loop employing an integrating element in the loop filter in conjunction with a logic circuit for indicating out-of-lock condition plus the sign of the frequency error and utilizes a source of direct current (DC) which is connected to the loop filter so as to increase the rate of change of the correction signal to the controlled oscillator and thereby speed-up tuning of the oscillator to the desired frequency.

8 Claims, 6 Drawing Figures

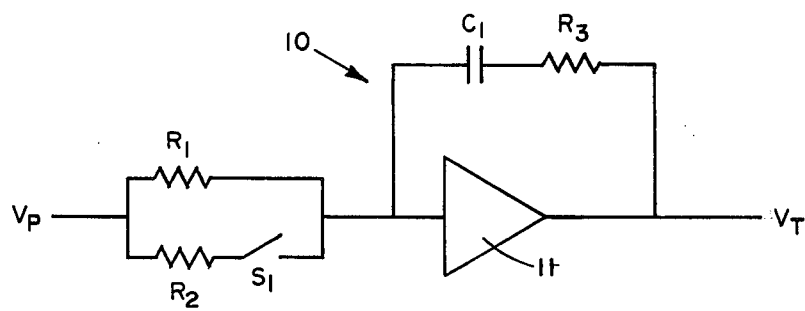
F I G. 1
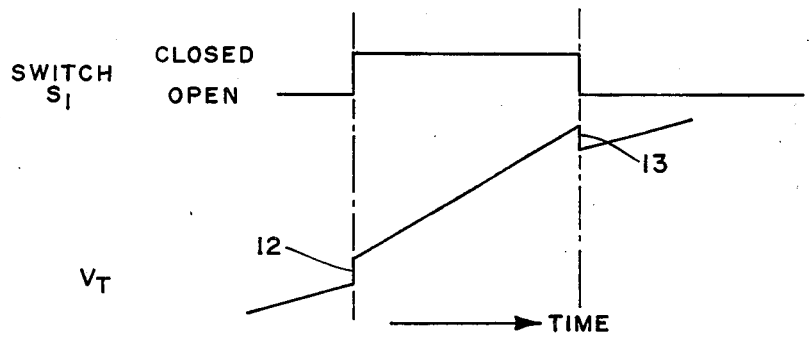
F I G. 2
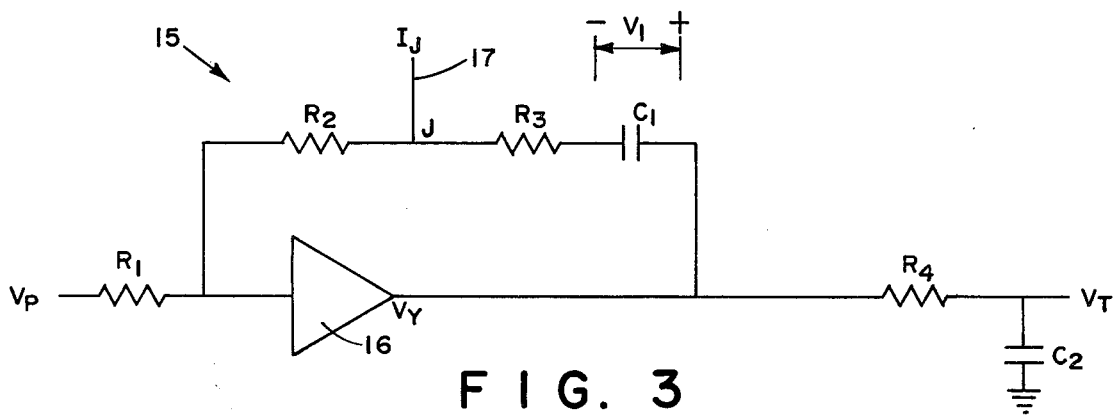
F I G. 3
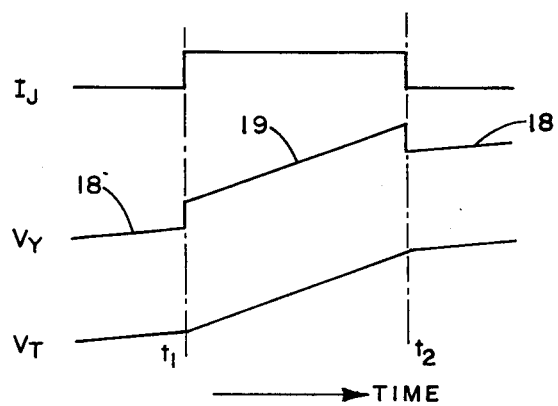
F I G. 4

PHASE LOCK SPEED-UP CIRCUIT

BACKGROUND OF THE INVENTION

This invention was made under a contract with the Department of the Navy.

This invention relates to phase-locked loop circuits and more particularly to such circuits which employ an integrating element in the loop filter.

The utility of a phase-locked loop circuit is substantially improved if the time required for the controlled oscillator to be returned from an out-of-lock condition to an in-lock condition is minimized. Attempts to decrease the pull-in time of phase-locked loops containing resistance-capacitance (R-C) low-pass loop filters have been made by temporarily decreasing the series resistance of the low-pass filter, either by shunting the filter input resistor with a non-linear element or with another resistor that may be switched into and out of the circuit. It may be difficult to find a non-linear element with a resistance characteristic properly shaped for the particular requirement. It may also be difficult to predict performance of such a non-linear element. In addition, because the decrease in resistance can degrade the effectiveness of the filter, it may be desired to set the final filter configuration at a controlled time. For these reasons, the switched series element is preferred over the non-linear element.

When an integrator type loop circuit is employed, as is often done, the preferred technique of speeding the response is use of the switched shunted input resistor which allows more current to reach the capacitor when the input resistor is shunted. The difficulty with such a circuit is that an additional resistor is required for the filter in the phase-locked loop in order to improve the stability, and the presence of this additional resistor produces an output transient when the shunt resistor is switched between the closed and open states. This transient is produced at the output because the change in input current produces a change in the voltage across the stabilizing resistor, the magnitude of the transient being proportional to the voltage across the input resistor. When such a system is used to cause an oscillator to move more rapidly to the desired frequency, the switch may be opened when the frequency is close to the desired value in order to prevent excessive overshoot or instability. A transient at this time can cause the frequency to again move away from the desired value.

This invention is directed to a solution to this problem.

OBJECTS AND SUMMARY OF THE INVENTION

A general object of this invention is the provision of a technique for decreasing the pull-in time of a phase-locked loop circuit having an integrator type loop filter without introduction of undesirable transients.

This and other objects of the invention are achieved by a circuit which selectably connects a direct current to the integrator filter of the phase-locked loop so as to increase the rate of change of the correction voltage output of the filter during the pull-in period of the circuit operation, thereby decreasing the pull-in time of the loop.

DESCRIPTION OF THE DRAWINGS

FIG. 1 is a schematic diagram of an integrator type loop filter for a phase-locked loop circuit illustrating a prior art technique for decreasing pull-in time of the circuit;

FIG. 2 is a timing diagram showing the operation of the circuit of FIG. 1;

FIG. 3 is a diagram of an integrator type loop filter showing the connection of a direct current input line in accordance with this invention;

FIG. 4 is a timing diagram showing the operation of the circuit of FIG. 3;

DESCRIPTION OF PREFERRED EMBODIMENT

Figure 5:
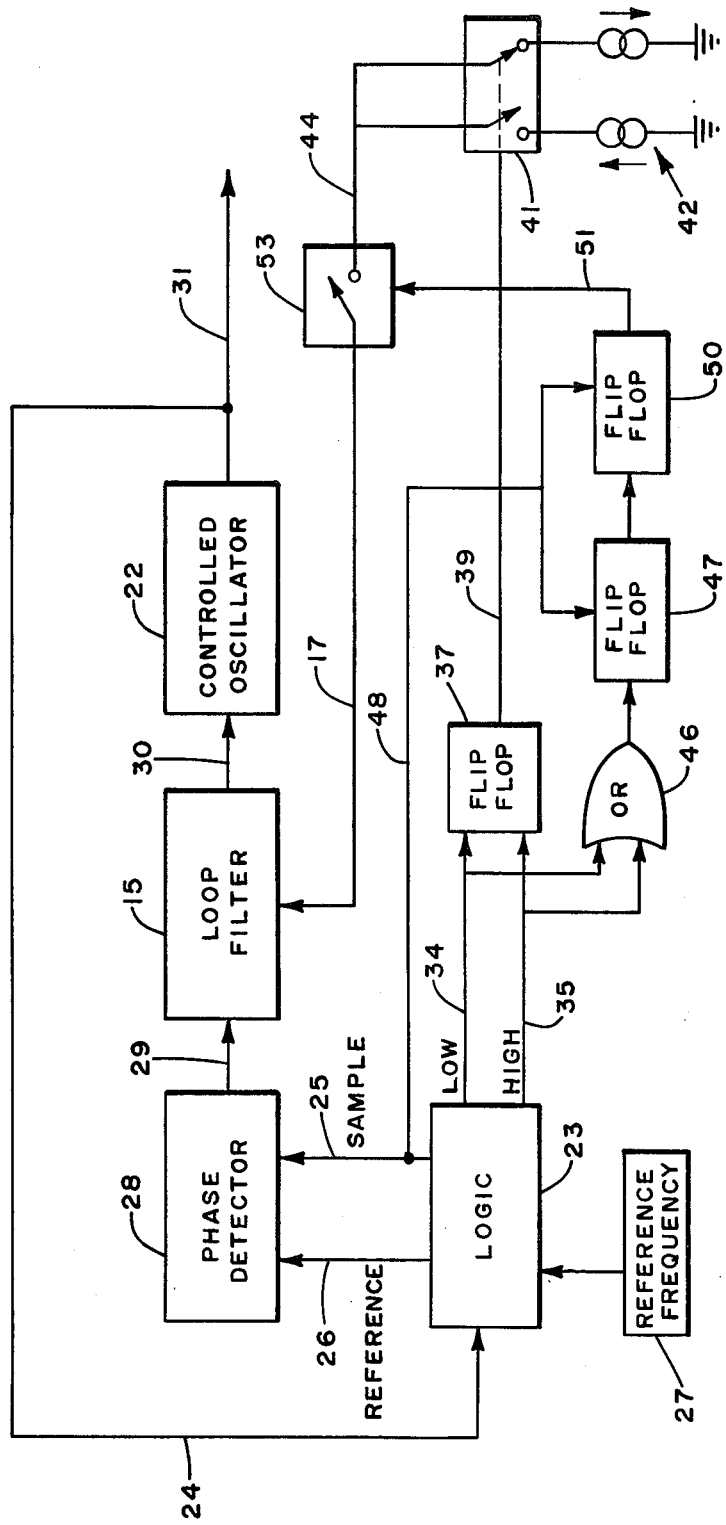
FIG. 5 is a block diagram of a typical phase-locked loop showing details of the pull-in speed-up circuit embodying the invention.

Referring now to the drawings, FIG. 1 illustrates a typical prior art integrator type loop filter 10 comprising a resistance $R_1$ and capacitance $C_1$ together with high gain amplifier 11. $V_p$ represents the input from a phase detector and the output voltage $V_T$ is the correction voltage which is applied to the controlled oscillator. In order to increase the speed of response of this integrator circuit, a resistor $R_2$ is selectively connectible in shunt with resistor $R_1$ by a switch $S_1$. When $S_1$ is closed, the effect is to reduce the resistance in the integrator input and thereby increase the value of the current into $C_1$ and thus the rate of change of the correction voltage $V_T$ to the controlled oscillator. The difficulty with this arrangement, however, is that a resistor $R_3$ is required for such a filter in a phase-locked loop for reasons of loop stability and, with the closing and opening of switch $S_1$, resistor $R_3$ produces transients in correction voltage $V_T$ as shown at 12 and 13 in FIG. 2. A transient is produced at these times because the change in input current when $R_2$ is either added to or removed from the circuit causes a change in voltage across $R_3$. The magnitude of the transient is proportional to the voltage across $R_1$.

This invention is illustrated schematically in conjunction with a loop filter 15 for a frequency synthesizer shown in FIG. 3. Resistance $R_1$ and capacitance $C_1$ together with amplifier 16 constitute an integrator. Resistances $R_2$ and $R_3$ connected in series between resistance $R_1$ and capacitance $C_1$ are stabilizing resistors which introduce a zero into the filter response at higher frequencies in order to reduce phase shift at the corner frequency of the loop. Resistance $R_4$ and capacitor $C_2$ connected at the output of the loop filter 15 are selected to have values so as to become effective at higher frequencies to remove ripple at the loop reference frequency from the correction or tuning voltage $V_T$. Resistor $R_4$ and capacitor $C_2$ are thus a low pass filter.

In accordance with this invention, in order to speed the response of this circuit, a direct current of proper polarity and the desired magnitude is injected on line 17 at the junction J between resistors $R_2$ and $R_3$. This current, designated $I_J$, adds to the current already passing through $R_1$ so that the sum of the two currents increase the rate of charge of capacitor $C_1$. This is illustrated in FIG. 4 at time $t_1$ when the voltage $V_Y$ at the output of amplifier 16 changes from one slope at 18 to a steeper slope at 19. It will be noted that $V_Y$ changes abruptly at times $t_1$ and $t_2$ when the current pulse $I_J$ begins and ends but that there is a smooth transition at these times in the tuning voltage $V_T$. The reason that there is no transient in $V_T$ when the current source is switched is because the current $I_J$ does not pass through resistance $R_2$ and the value of resistance $R_3$ is chosen so that $$R_3C_1 = R_4C_2. \quad (1)$$

The absence of any abrupt steps in tuning voltage $V_T$ in FIG. 4 when the current $I_J$ is switched is shown from the following equations. Assume $V_p$ is zero. Then, initially, $$V_1(0) = V_T(0) \quad (2)$$

where $V_1$ is the voltage across capacitance $C_1$. Subsequently, the voltages $V_T$ and $V_1$ are obtained by integrating the charges into $C_2$ and $C_1$, respectively.

$$V_T = \frac{1}{R_4C_2} \int_0^t (V_Y - V_T) \, dt + V_T(0) \quad (3)$$

and $$V_1 = \frac{1}{R_3C_1} \int_0^t (V_Y - V_1) \, dt + V_T(0) \quad (4)$$

Comparing these last two equations, it is seen that $V_T$ and $V_1$ are identical. Since it is also known that $$V_1 = \int_0^t I_J \, dt + V_1(0), \quad (5)$$

the result is $$V_T = \int_0^t I_J \, dt + V_T(0). \quad (6)$$

Thus, a waveform such as $V_T$ in FIG. 4 is produced (the steady slope at 18 being due to a constant non-zero $V_p$) and there is no output transient at times $t_1$ and $t_2$.

A simplified block diagram of a circuit embodying this invention is shown in FIG. 5. The basic phase-locked loop comprises controlled oscillator 22 which drives logic circuit 23 via line 24. Logic circuit 23 divides the frequency of the oscillator output signal by a predetermined number N, such that, at lock, the divided output generates a sample on line 25 at the same frequency as a reference signal on line 26. The reference signal is derived from an external reference frequency 27.

Phase detector 28 generates a voltage $V_p$ on line 29 proportional to the phase difference between the sample and reference pulses. This voltage passes through loop filter 15 and line 30 to controlled oscillator 22 and maintains its frequency during lock at a constant ratio to the external reference frequency. If the loop is not locked, logic circuit 23 so spaces the reference and sample pulses that the phase detector output $V_p$ will be a steady voltage which a loop filter 15 converts to a voltage $V_T$ on line 30 moving in such a direction as to tune the oscillator to the lock frequency. The output of the controlled oscillator is on line 31.

Logic circuit 23 may be the same as that described in U.S. Pat. No. 4,001,713 and also generates pulses on lines 34 and 35 which indicate that the oscillator frequency is respectively lower or higher than the reference frequency when the loop is out-of-lock. Lines 34 and 35 are connected to a bistable flip-flop 37, the state of which is determined by the line 34 or 35 from which the last pulse is received. The state of flip-flop 37 thus indicates the direction of the frequency error. The output of flip-flip 37 on line 39 is applied to switch 41 which controls the polarity of a DC source 42. Switch 41 is illustrated schematically in the drawing and may comprise a solid state switching device, such as a field effect transistor. The output of switch 41 on line 44 is thus DC having a polarity determined by the operating state of flip-flop 37.

When either low or higher error signals appear on lines 34 or 35, respectively, they pass through OR gate 46 and set bistable flip-flop 47. Flip-flop 47 is reset by the sample pulse output from logic 23 via line 48. The same pulse causes the state of flip-flop 47 to be passed to, and thereby sets, bistable flip-flop 50, which, when set, indicates an out-of-lock state. The output of out-of-lock flip-flop 50 is applied on line 51 to switch means 53 which connects the polarity switch output line 44 to loop filter 15 via line 17. Thus, when an out-of-lock condition exists as indicated by a low or high signal on output lines 34 or 35 of logic circuit 23, switch means 53 closes to connect the DC source 42 to the loop filter. Switch means 53 remains closed until oscillator 22 returns to a locked condition, at which time there is no output from OR gate 46, flip-flop 47 is not set, flip-flop 50 assumes its in-lock state and the absence of an output on line 51 causes switch means 53 to open, thereby disconnecting the DC source from the loop filter.

Figure 6:
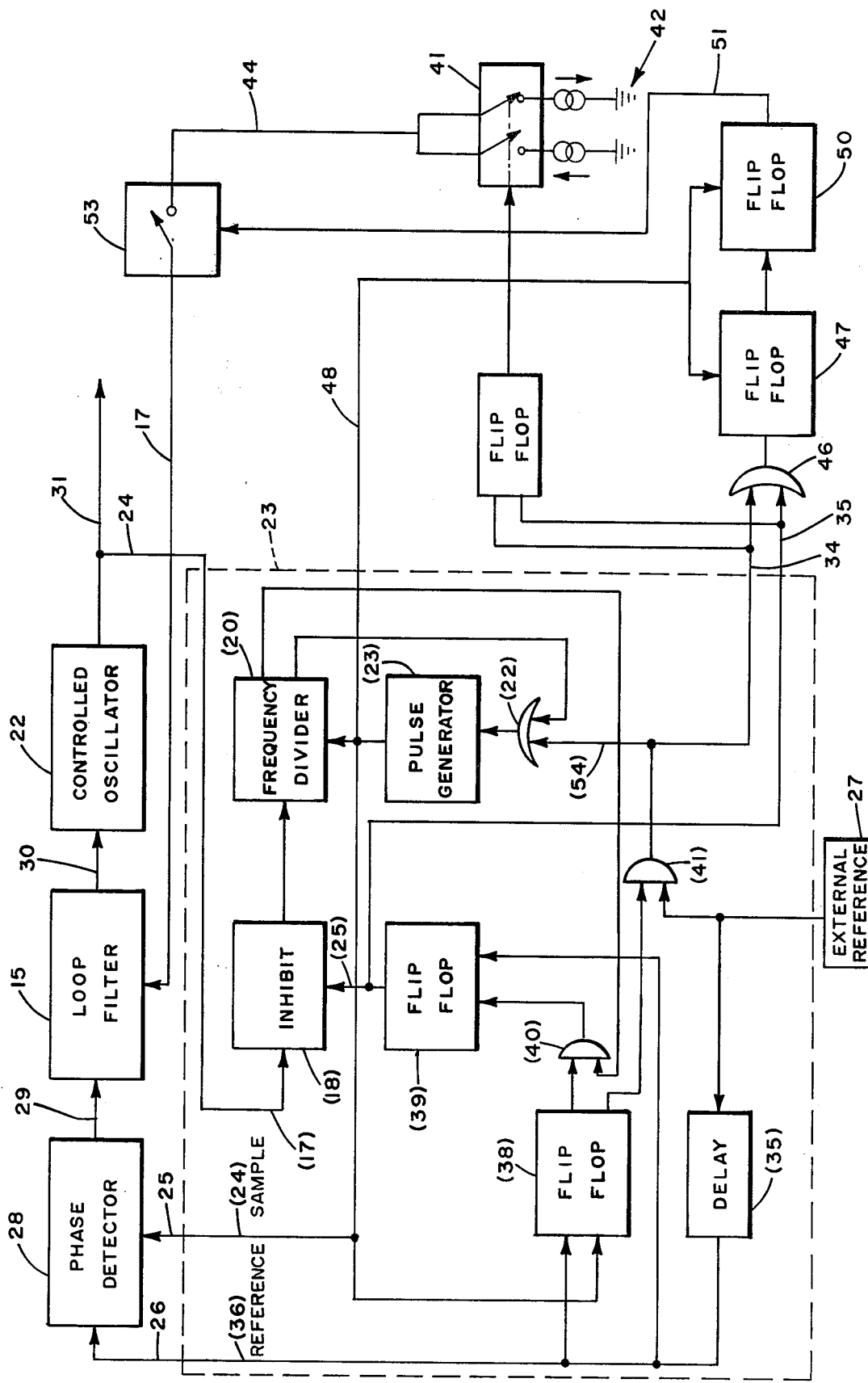
FIG. 6 is a diagram similar to FIG. 5 showing details of the logic circuit used to implement the invention.

FIG. 6 is identical to FIG. 5 except that the logic circuit 23, indicated in FIG. 6 by the broken line block, is shown in the same detail as disclosed in U.S. Pat. No. 4,001,713. Reference characters on the components of logic circuit 23 within the broken line outline in FIG. 6 are enclosed in parentheses and are identical to the reference characters for like parts in the above-identified patent. The reference characters on the components outside the broken line box are identical to those for like components shown in FIG. 5. Since the circuits of FIGS. 5 and 6 are identical in other respects and operate in the same manner, and since the logic circuit 23 operates the same as described in the foregoing patent, a further explanation of the circuit of FIG. 6 is not necessary to an understanding of this invention.

In some loops, $R_4$ and $C_2$ may be absent. Then a low pass filter may be created by shunting $R_2$ with a cpacitor or there may be no low pass filter. In such loops, $R_3$ is set equal to zero and the circuit improvement is still obtained.

Other circuit elements may be inserted between $C_1$ and $R_4$ or between the loop filter and controlled oscillator without altering the improvement as described above. A linearizer, used to compensate for oscillator tuning characteristic non-linearity, may be such an element.

Because the addition of the speed-up current gives the loop an effectively higher gain, it may be desirable to keep the current source off after one usage during a frequency pull-in. This prevents repeated switching of current and of current polarity due to overshoots caused by high gain. This inhibit can be removed when each new frequency is commanded and reestablished after each zero-frequency error condition.

What is claimed is:

1. In a phase-locked loop circuit having a controlled oscillator with an output frequency $f_o$, a reference signal source having an output frequency $f_r$, logic means comprising a frequency divider responsive to frequency $f_o$ for dividing same by a predetermined number N, said logic means also being responsive to frequency $f_r$ and producing a first output signal when $f_o/N$ is greater than $f_r$ and a second output signal when $f_o/N$ is less than $f_r$, a phase detector responsive to frequencies $f_o/N$ and $f_r$ and producing an error signal output corresponding to the phase difference between the sample pulse train at frequency $f_o/N$ and the reference pulse train at frequency $f_r$, loop filter means responsive to said error signal for producing a correction signal for tuning said oscillator so as to maintain a phase-locked condition in which a predetermined fixed ratio N exists between $f_o$ and $f_r$, said loop filter means comprising an integrator having a resistance $R_1$ and a capacitance $C_1$ and a low pass filter having a resistance $R_4$ and a capacitance $C_2$, said filters being connected in series, said loop filter means also having first and second stabilizing resistors $R_2$ and $R_3$, respectively, connected in series between resistor $R_1$ and capacitor $C_1$, the improvement comprising means for increasing the rate of said tuning of said oscillator comprising means for adding direct current (DC) to a junction between resistors $R_2$ and $R_3$, said resistors and capacitors having values for satisfying the relation $R_3C_1 = R_4C_2$.

2. The circuit according to claim 1 comprising
a DC source having an output,
means for controlling the polarity of the said output from said source, said polarity controlling means being responsive to the first and second output signals of said logic means for providing said source output with opposite polarities, respectively,
switch means connected between the output of said source and the junction between resistors $R_2$ and $R_3$, and
switch control means connected to said switch means and being responsive to either of the first or second output signals of said logic means for connecting said source output to said junction whereby to increase the rate of change of said correction signal and speed up the tuning of said oscillator to the phase locked condition.

3. The circuit according to claim 2 in which said polarity controlling means comprises a switch connected between and in series with said source and said switch means, a flip-flop circuit having first and second operating states corresponding to frequency error direction determined by $f_o/N$ being respectively greater or less than $f_r$, and having an output operatively connected to said switch whereby to change the polarity of said source in accordance with the direction of frequency error.

4. The circuit according to claim 3 in which said switch control means comprises an OR gate having first and second input terminals connected to the first and second output signals of said logic means, a first bistable flip-flop having a set terminal connected to the output of said OR gate and a reset terminal connected to the $f_o/N$ input to said phase detector, said flip-flop being set in response to an output from said OR gate whereby to close said switch means, and a second bistable flip-flop connected to the output of said first flip-flop and to the $f_o/N$ input to said phase detector, the output of said second flip-flop being operatively connected to said switch means and being indicative of the state of said first flip-flop immediately prior to the last $f_o/N$ pulse.

5. A phase-locked loop comprising
a controlled oscillator having a tuning control input,
a phase detector,
a reference frequency source,
said phase detector being responsive to the outputs of said oscillator and said source for producing a correction signal,
a loop filter circuit connecting the output of said phase detector to said input of said oscillator,
said circuit comprising an integrator having a resistance $R_1$ and a capacitance $C_1$ and a low pass filter having a resistance $R_4$ and a capacitance $C_2$, said filter and said integrator being connected in series,
said circuit also having stabilizing resistors $R_2$ and $R_3$ connected in series between resistor $R_1$ and capacitor $C_1$ with resistors $R_1$ and $R_2$ being adjacent, said resistors and capacitors having values to satisfy the relation $R_3C_1 = R_4C_2$, and means for adding direct current (DC) of predetermined polarity to the junction between resistors $R_2$ and $R_3$ when the oscillator is out-of-lock whereby to increase the absolute value of the rate of change of the correction signal and correspondingly increase the rate of tuning of said oscillator.

6. The loop according to claim 5 in which said last named means comprises a DC source having an output connected to said junction, and polarity controlling means connected to said DC source and responsive to the inputs to said phase detector to select the polarity of said DC source output to correspond to the desired direction of change of oscillator tuning to return the oscillator frequency to the in-lock condition.

7. The loop according to claim 6 with a switch connecting said DC source output to said junction, said switch being open when the loop is locked, and means for detecting an out-of-lock condition of the loop, said detecting means being operably connected to said switch for closing same when the loop is out-of-lock.

8. A phase-locked loop comprising
a controlled oscillator having a tuning control input,
a phase detector,
a reference frequency source,
said phase detector being responsive to the outputs of said oscillator and said source for producing a correction signal,
a loop filter circuit connecting the output of said phase detector to said input of said oscillator,
said circuit comprising an integrator having a resistance $R_1$ and a capacitance $C_1$,
said circuit also having a stabilizing resistance $R_2$ connected in series between resistance $R_1$ and capacitance $C_1$, and
means for adding direct current (DC) of predetermined polarity to a junction between resistance $R_2$ and capacitance $C_1$ when the oscillator is out-of-lock whereby to increase the absolute value of the rate of change of the correction signal and correspondingly increase the rate of tuning of said oscillator.

* * * * *